United States Patent [19]

Mauge

[11] Patent Number: 4,821,270
[45] Date of Patent: Apr. 11, 1989

[54] METHOD FOR DECODING DATA TRANSMITTED ALONG A DATA CHANNEL AND AN APPARATUS FOR EXECUTING THE METHOD

[75] Inventor: Jacques Mauge, Eindhoven, Netherlands

[73] Assignee: U.S. Philips Corporation, New York, N.Y.

[21] Appl. No.: 937,596

[22] Filed: Dec. 3, 1986

[30] Foreign Application Priority Data

Dec. 13, 1985 [FR] France ............................. 85 18466

[51] Int. Cl.$^4$ ............................................. G06F 11/00
[52] U.S. Cl. ......................................... 371/47; 371/5; 375/114
[58] Field of Search .................. 371/47, 43, 37, 44, 371/39, 45, 38, 40, 41, 42; 364/900, 200

[56] References Cited

U.S. PATENT DOCUMENTS

| | | | |
|---|---|---|---|
| 3,336,467 | 8/1967 | Frey | 371/47 |
| 4,466,099 | 8/1984 | Meltzer | 371/47 |
| 4,524,445 | 6/1985 | Fujii | 371/47 |
| 4,654,480 | 3/1987 | Weiss | 371/47 |
| 4,680,765 | 7/1987 | Doland | 371/47 |
| 4,686,690 | 8/1987 | Sato | 371/47 |
| 4,696,008 | 9/1987 | Takei | 371/47 |

OTHER PUBLICATIONS

"Specification of Radio Data System RDS for VHF/FM Sound Broadcasting", Tech. 3244-E, appendices 1 and 2, pp. 33–39 (Mar. 1984).

*Primary Examiner*—Michael R. Fleming
*Attorney, Agent, or Firm*—Thomas A. Briody; Jack E. Haken; Anne E. Barschall

[57] ABSTRACT

Method of decoding data making it possible to correct certain errors, e.g. in synchronization and transmission. The method relates to decoding data transmitted in groups of blocks. Each block has n1+n2 bits, where n1 is the length of a corresponding information word. The information word is extended to an error protection block of n1+n2 bits by application of a linear error protection code and an off-set which indicates the position of the block within a group. Synchronization is established by incremental generation of a position-indicating syndrome from the block. If error correction is found to be necessary, it begins after synchronization. Synchronization is restarted if too many errors occur. A device for implementing the method includes a radio receiver (21), a microprocessor (22) for its control and a universal decoder (11) consisting on the one hand of a demodulation (13) and clock regeneration (12) component, the input of which is connected to the multiplex output of the radio receiver (21) and, on the other, of a broadcast data processing microprocessor (14), the output of which is connected to said microprocessor (22) for controlling the radio receiver.

14 Claims, 3 Drawing Sheets

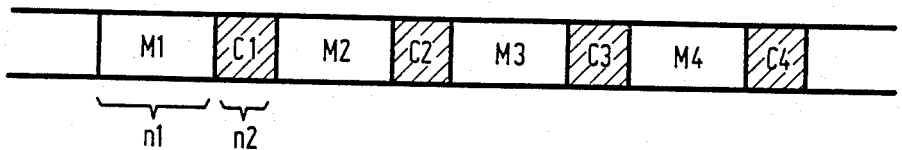
FIG. 1
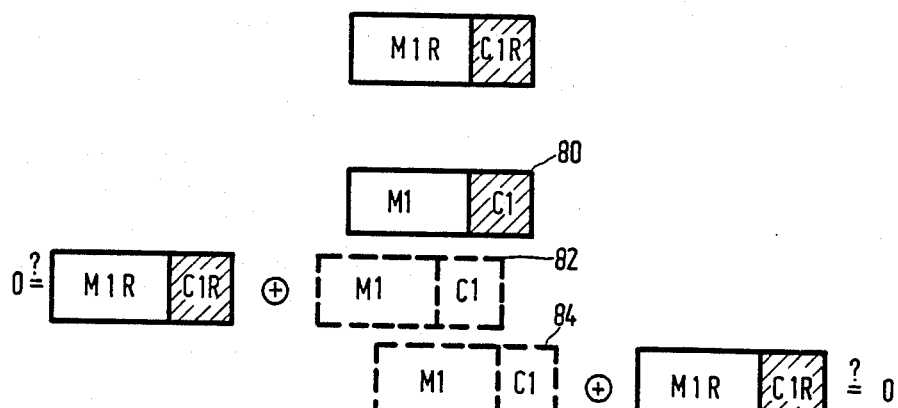
FIG. 2
FIG. 4

METHOD FOR DECODING DATA TRANSMITTED ALONG A DATA CHANNEL AND AN APPARATUS FOR EXECUTING THE METHOD

BACKGROUND OF THE INVENTION

1. Field of the Invention

The invention relates to a method for decoding data transmitted along a data channel. The data are arranged in groups. Each group contains a fixed number of N blocks. Each block (J) contains an information word MJ of n1 bits which by means of information of a linear error protection code has been extended to an error protected block of (n1+n2) bits. In the method, to each error protected block in a group, a predetermined off-set word WJ has been added by bitwise EXCLUSIVE ORING. The off-set word indicates the position of the block in question within its group.

2. Prior Art

The above encoding system is known from a publication by the European Broadcasting Untion (EBU), Techn. 3244-F, appendix 2, part 2.2 thereof describing an implementation of a decoder.

SUMMARY OF THE INVENTION

It is an object of the present invention to provide a decoding method to meet the known encoding specifications, so that certain errors may be corrected, notably synchronization errors of the decoding station, and also transmission errors, even under adverse transmission circumstances, while still allowing for a simple implementation in an elementary set-up.

The object of the invention is realized in that the decoding method comprises the steps of (a) in an initialization phase receiving a sequence of (n1+n2) data bits from said channel and therefrom generating a first syndrome by means of incremental operations, each incremental operation taking into account exactly one most recently received data bit; (b) comparing said first syndrome to respective standard syndromes, the latter corresponding to all possible off-set words; (c) in case of non-correspondence omitting the least recently received data bit from said (n1+n2) data bits and updating said first syndrome while accounting for a still more recently received data bit and disregarding a least recently received data bit until either in step (b) or in step (c) a correspondence occurs with a standard syndrome corresponding to one of said predetermined off-set words; (d) in a user phase following step (c) generating for each block of (n1+n2) bits received over said data channel an associated syndrome and comparing it with its position indicating standard syndrome(s), each next block having a presumed next following position in the sequence of groups; (e) in case of correspondence outputting a first strategy controlling signal, while outputting the block's information word to a user; in case of non-correspondence executing an error protection operation on the error-protected block of n1+n2 bits without its associated off-set word, while outputting a second strategy controlling signal; (f) and wherein a predetermined time-sequence of said first and second strategy controlling signals restarts step (a).

The invention may be particularly useful in systems for the radio transmission of data, especially in the FM band. Such systems, like the one known by the name of RDS (Radio Data System) make it possible to insert data, unbeknown to the listener, serving especially to tune the radio receiver and identify the mono or stereophonic sound radio broadcast program. With receivers fitted with a display screen, the data also makes it possible to show the name and type of program to which the receiver is tuned, to identify the decoder, a radio text, etcetera, and other information relating more particularly to motorists with a car radio, like road messages.

However, the invention may also be used in a one-way point-to-point intercommunication, in other types of modulation, and in completely different application environments.

The principle of the decoding is that the beginning of the synchronization can only be effected if a certain number of blocks have been received in sequence error-free; however after synchronization has been established, a certain amount of errors is acceptable in that within each block a certain error protection is effected. In the above-cited specification, a group contains four blocks, whereas each block contains an information word of 16 bits. The error protection is effected by means of a systematic code and an amount of redundancy of 10 bits. The redundancy used allows for correcting single bit errors and burst errors up to a maximum length of five bits. It is known by itself to use a particular amount of redundancy to implement various different error protection strategies. For example, one such strategy is to omit the full error correcting capability of a particular code, but to enhance the error detection capability. For example, a code with a bitwise minimum Hamming distance of four may be used either for single bit error correction, double bit error detection, or alternatively, for treble bit error detection. Even in a single application, certain code blocks may be treated differently from other code blocks. The advantage of a linear error protection code is that the sum of two code blocks again constitutes a code block. The code may be either systematic on the bit level or non-systematic on the bit level. In the former case a correct block has the information word contained within n1 specific bit positions. In the latter case, the information word must be retrieved from a larger number of bit positions (up to a maximum number of (n1+n2) bit positions).

After the initialization or synchronization phase has been successfully concluded, the user phase starts. In certain situations, the amount of error in the user phase increases in such a degree, that synchronization must be considered as lost. In that case, the system returns to the synchronization phase. The errors correctable and/or detectable could occur in particularly in a vehicle, e.g. a car fitted with a car radio, when it passes beneath a bridge. This protection is very effective in that at various predetermined positions in the bit stream (spaced at n1+n2 bits apart) the actual syndrome generated is compared to the appropriate standard syndrome(s). If the comparison yields equality, synchronization is correct and also transmission is considered errorfree. If the comparison does not yield equality, an error protection operation is effected. The result of such operation may be detection of one, two or more errors (considered as uncorrectable), correction of one or more bit errors, or a combination thereof. The type of error is stored in an error register means. The system continuously keeps book of those error types and makes a decision after processing of each block as to the expected quality of the transmission. In certain applications the strategy of this decision is adjustable. One particular strategy would be: each block with an error (either correctable or not) increases an error score. If a certain limit is attained, the system is considered out of synchronism. If a correct block is received, the error score is reset to zero. Other strategies are explained hereinafter.

The specifications issued by the European Broadcasting Union concerning the RDS system stipulate that the information word of the first block of the group shall remain the same. The invention takes advantage of this special provision in order to detect and correct any slip by ±1 bit which could occur inside a group. This is why, in one embodiment of the invention, with the first block identical along the data channel, the user phase is also intended to comprise a phase of seeking and correcting the bit slip error. After the errorless detection of this first block the possible slip detected is therefore retained while shifting the synchronization instant by 0, +1 or −1 bit cells. In this way the second and further blocks will have a much lower probability for an uncorrectable error.

The invention is advantageous in that no large processing means is required. Especially, only a limited memory capacity (less than 4K bytes) is required. Thereby the invention also relates to an apparatus for executing the above-mentioned method. Such apparatus may comprise a universal decoder made up of a demodulation and clock regeneration component. The input thereof is connected to a multiplex output of a radio receiver. Furthermore, the apparatus comprises a microprocessor for processing the broadcast data. The output thereof is connected to a second microprocessor for controlling the radio receiver. The use of the output data from the universal decoder may be effected in various ways, depending on the way the data is applied in an environment, on the content of the data, and of the quality and/or safety levels intended.

Further advantageous aspects are recited in the dependent claims.

BRIEF DESCRIPTION OF THE FIGURES

The following description, given with reference to the attached drawings, showing non-limitative examples, will show of what the invention consists and how it can be produced.

FIG. 1 shows the basic structure of the data channel.

FIG. 2 shows how the syndrome of data channel block is calculated.

FIG. 4 illustrates the detection and correction of a slip error.

DETAILED DESCRIPTION OF THE PREFERRED ENVIRONMENT

Underlying Organization of the Invention

FIG. 1 shows the structure of the data channel. The largest component is a group comprising, for example, N=4 blocks. Each block J (J=1 to 4) consists of an information word MJ of n1 bits and a control word CJ of n2 bits. The recommendations of the European Broadcasting Union concerning the RDS system specify a 16 bit information word and a 10 bit control word, so that a block has n1+n2=26 bits.

FIG. 2 shows the generation of a syndrome SJ for a block of (n1+n2) bits. The generation is effected by multiplication by a parity check matrix of dimensions (n1+n2)xn2 bits. The resulting syndrome is bit string of n2 bits. Syndrome calculation for a non-systematic code is effected in a corresponding manner.

Description of the Decoding

Figure 3:
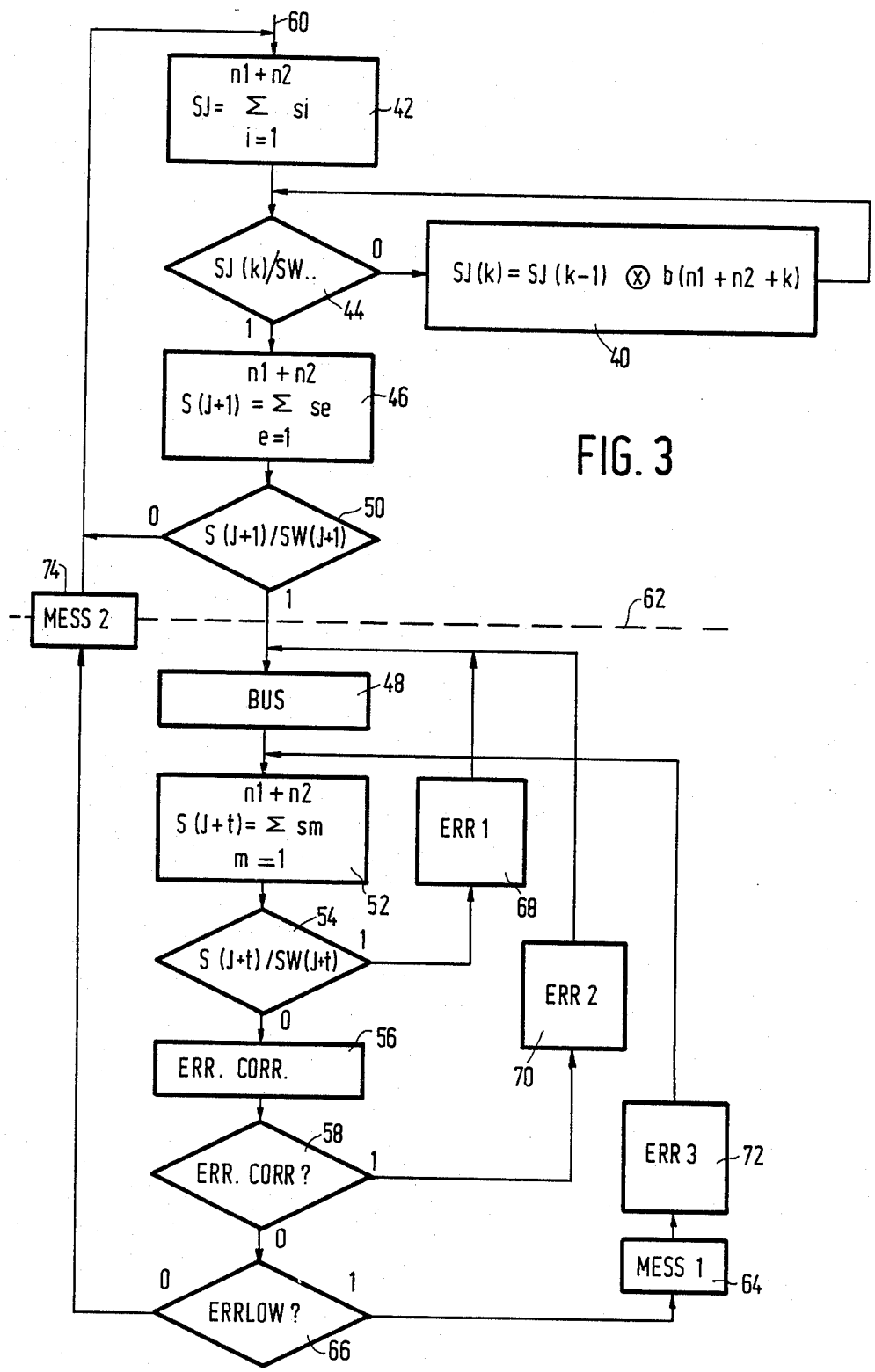
FIG. 3 is a flow chart of a decoding process of the invention.

FIG. 3 is a flow chart of a decoding process of the invention. This process is made possible in that, on the transmitter side, a so-called off-set word is added (bit-wise EXCLUSIVE ORED) to the control word CJ of each block. The content of each off-set word is one-to-one correlated to the position of the control word (and consequently, of the block in question), within the group. For the organization of FIG. 1, four different off-set words would suffice. However, for organizational reasons, the cited RDS system has seven different off-set words. Certain of these off-set words, in addition to indicating the block's position within the group, could therefore serve other purposes, such as indicating the type of the block, or the type of the group in question. However, this latter information is not used on the level of the present invention.

The flow chart of FIG. 3 starts at input 60. Here, the data bits are received, but their relative positions within either block or group of blocks are not yet known. The upper part of the Figure, above the broken line 62 gives the initialization or synchronization phase. That is, as long as the system is in this synchronization process, the decoded data is not yet considered as reliable. Block 42 represents the initialization phase. Herein the syndrome SJ of the block constituted by the first (n1+n2) bits, with the off-set word added thereto, is calculated. In order to limit time and memory capacity for the calculations, the syndrome SJ is calculated incrementally in that for each data bit received a preliminary syndrome bit string is updated by an increment bit string si, that is the contribution of the most recent data bit to the ultimate syndrome bit string SJ. This goes on, until a main counter, that counts the data bits, has reached a position (n1+n2). At that point it would in principle be possible that synchronization had occurred. Thus, the system goes to block 44, which has two exits. Block 44 represents a comparison between the syndrome SJ actually generated and the standard syndromes SW each of which would have been generated on the basis of a particular off-set word WJ alone. Note that the off-set word constitutes a quasi-error word. These quasi-error word syndromes or standard syndromes are present in a comparison register means RC. Thus, in the setup of FIG. 1, at least four such standard syndromes would be present. If the comparisons are all negative there are two possibilities: either the block window is mispositioned, or there is an error present in the data received. In case of a negative output (0), the system goes to block 40, which tries to reposition the block window. For each next-following data bit b(n1+n2+k) the syndrome is further updated. This is effected by wiping out the contribution of data bit b(k) and by adding the contribution of the data bit b(n1+n2+k) to the syndrome bit string, which operation has been shown symbolically. If k reaches the value (n1+n2), the window should have been positioned correctly; then the negative comparison result surely has been caused by an error. The system of FIG. 3, however, goes on with repositioning the block window, which in principle could go on indefinitely. Higher-level measures, such as a time-out provision (signalling an unusable connection) fall outside the scope of the present invention. Due to the linear character of the code (the sum of two code blocks again represents a code block) bit errors outside the block window do not contribute to the syndrome. The linear character of the code also allows for the incremental generation of the syndrome SJ in block 42.

Figure 5:
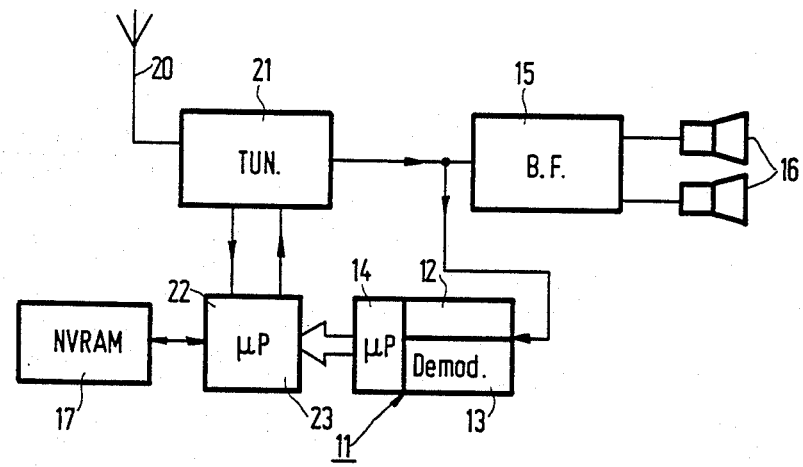
FIG. 5 is a diagram of a device for implementing the decoding method of the invention.

Thus, in case of a reasonably low number of errors, at some time or another, the comparison in block 44 will give a positive result (1) and the system proceeds to block 46. Herein it is presumed that the previous window is correctly positioned; also, the identity of the previous standard syndrome is known. Therefore, the standard syndrome(s) for the next expected off-set word(s) is (are) chosen from the comparison register means. Note that this expectation may be unique (in the case of exactly N different off-set words). In other cases it could be ambiguous. For example, in the case of N=4 and seven off-set words, the number of possibilities for the expected off-set word syndrome could vary between one and four. Furthermore, in block 46 the next syndrome S(J+1) is calculated in exactly the same way as in block 42. After calculation, in block 50, the new syndrome S(J+1) is compared to the (one or more) selected syndromes from the comparison register means. In the same way as in block 44, the result can be positive or negative. If the result is negative, the system assumes that synchronization is absent and it returns to block 42. If the result is positive, the system assumes that synchronization is correct, and it may go to the data processing part proper or user phase under broken line 62. The degree of safety can be increased further in that the process of blocks 46 and 50 can be repeated one or more times, while a secondary counter keeps track of the number of these repetitions. If the number reaches a predetermined level, the line 62 may be transgressed. In certain applications only a single correct comparison in block 44 would be sufficient, its output directly leading to block 48. On the lower side of broken line 62 there is assumed correctness of the two most recently received blocks (or of an even higher number in case the secondary counter cited hereabove had been used). The system can now transmit the data word(s) of one (the most recent) or more of these correct blocks to a user. This operation is illustrated by block 48 "BUS": the actual function of the bus subsystem is illustrated in FIG. 5. Next, the operations of blocks 46/50 are repeated in blocks 52/54. In block 54 the same comparison is made as in block 50, each time for the appropriate standard syndrome(s). If the comparison indicates no error, the system proceeds via block 68 to block 48, wherein the information word is made available to the user. The error strategy block 68 is considered later. In principle, the loop of blocks 48, 52, 54, 68 may be executed continually. In contradistinction to block 50, however, now also the error protection feature is taken into account. Thus, if there is a discrepancy (0 in block 54), the system goes to block 56. In block 56, an error protection operation on the error-protected block of (n1+n2) bits without its associated off-set word is effected while making use of the syndrome proper. The off-set word is ignored by subtracting it (which is the same as bit-wise EX-CLUSIVE-ORING). In the particular application of the RDS-system, there are various possible signalizations a. single bit error signalled plus corrected data word;
 b. compound error signalled, possibly in combination with an indication of the error burst length;
 c. signalization of an incorrectable error (two or more bit errors not in a single burst or a burst error of length greater than five). In block 58 this signalization is analyzed, with respect to correctibility. If the answer is "correctible" (1), the system, via error strategy block 70 goes to block 48, wherein the information word is made available to the user. Also the loop of blocks 48, 54, 52, 58, 70 may, in principle, be executed continually. If in block 58, the error proves incorrectable, the system goes to block 66. In block 66, the actual state of the error protective strategy is evaluated. This actual state is represented by a numerical value. If this value is low (1), the system goes to block 64. Herein, a first message is made available to a user. This first message may signal: information word irretrievable. Next, the system goes to error strategy block 72. Thereupon, the system goes to block 52. Thus, it is presumed that on the one hand, no synchronization error had occurred. On the other hand, the information word could not be made available to the user and block 48 is bypassed. If however, in block 66 the numerical value proves to be high (0), it is assumed that synchronization had been last. The system goes to block 74. Herein, a second message is made available to a user. This second message may signal: synchronization lost. Thereafter, the synchronization process is restarted. The error strategy blocks 68, 70, 72 are considered hereinafter. A modification of the set-up of FIG. 3 is to connect test block 66 directly at the negative output of block 54, block 66's two outputs leading to block 74 and 56, respectively. The negative output of block 58 would then directly lead to block 64. Various other interconnection schemes would yield good results.

The error strategy blocks 68, 70, 72 relate to the updating of the numerical value in the error register. A first possibility is to increment the numerical value by one if there is an incorrectable error (block 72) and to reset the numerical value to zero if there is either an errorless situation (block 68) or if there is a correctable error. A second possibility is to increment the numerical value by two if there is an incorrectable error, to increment by one if there is a correctable error, and to reset to zero if there is no error. Other strategies, that take into account the amount of errors in a block could be used, such as increment by one in case of a single bit error, increment by two in case of a correctable burst error, increment by five in case of an incorrectable error, reset in case of a correct block. Still other strategies, that would take into account the recent error history, could also be used.

The critical value in block 66 for deciding when synchronization has been lost depends on various criteria. As a general rule, this value is greater if the number of successive blocks to be received errorless in the synchronization phase is higher. For example, if the reception conditions are good, in the synchronization phase two successive blocks must be received error free (as in FIG. 2). Then, the critical value would lie between 16 and 64. On the other hand, if the reception conditions are poor, only a single errorless block in the synchronization phase would imply synchronization. Then, however, the critical numerical value could be chosen lower, such as only 4. The reception conditions can be determined dynamically, for example on the basis of the amplitude or so-called field strength of the received broadcast, alone, or in combination with the well-known multi-pass conditions (coexistence of various transmission paths by virtue of reflections by buildings and the like), or, alternatively on the basis of past transitions between the synchronization phase and the user phase.

In certain channel organizations the first block of a group contains always the same information word. Therefore, the whole block, incremented by a single off-set word is always identical. In this respect, FIG. 4 illustrates the detection and correction of a bit slip error. As soon as the first block (of any arbitrary group) has been decoded errorless (block 54 in FIG. 3) once, it is stored in an additional register in the form originally received. Upon reception of the first block of any next-following group it is compared to the stored block. This comparing may be done by bitwise EXCLUSIVE ORING and is effected, once in the presumably correct position in time (80 in FIG. 4) and also with one bit off-set in each of the two possible directions (82, 84 in FIG. 4). If the correct position yields an erroneous comparison, but either of the other two positions indicates a good comparison, the synchronization window is shifted in the corresponding direction. A different strategy is that the slip detection is effected only after the first block has been found incorrectible: in block 58 also the block number is taken into account. Now, various operations in the flow chart may take such time as to necessitate time sharing of the processing facilities of, for example a microprocessor or microcontroller. This could occur if the error correction operation is not yet ready before the first bit of the next block must be taken into account in block 52. Thus, the calculations for determining the time shift would also take such time as to produce a result only after the processing of the second block has begun already. Thus, in the case of a bit slip present, the second block would almost never lead to an errorless or "correctable error" situation. Now, the cited RDS system is such that the second block of a word is critical: if it is lost, the whole remaining group is considered lost. In FIG. 3 this could be effected in that the block 66 also takes into account the block number and in case of "block 2" appears incorrectible, the operation in the block 48 is de-activated for the remaining blocks of the group in question. However, to avoid the incorrectability of block 2 in case of a forward slip, the calculations on block 2 then are delayed by one bit position. This, in one method, may be represented by the omission, of the first bit: the actual first bit received is now the second bit of the block and the calculations are adapted to this slip. In the multiplication by the parity check matrix the first multiplication thus is by the second row, and so on. The slip thus is translated into an "always zero" for the first data bit. If the bit should be zero, no problem is encountered. If the bit should be "one", this implies an (additional) single bit error that most often is correctable. A higher level solution would be to actually advance the syndrome calculation of block 2, in that the last bit of block 1 (slip assumed zero) is taken into account both for block 1 and for block 2, the latter representing a negative slip of block 2 by one bit position. After n1+n2 bits have been taken into account for block 2, the actual slip of block 1 may be known. For a value of this slip of −1, 0, and +1 bits, the system should, for block 2, execute the operations of block 40 in FIG. 3 zero, one, or two times. Similar considerations apply for block one.

DESCRIPTION OF AN EMBODIMENT OF A DEVICE

FIG. 5 is a diagram of a device for implementing the decoding method of the invention. Element 20 is an antenna for receiving a broadcast signal. Element 21 is a conventional radio receiver or tuner. The radio receiver is bidirectionally connected to its controlling microprocessor or microcomputer 22. Such control is conventional in present day systems. Element 15 represents the low-frequency decoding and amplification of the audio signal. Elements 16 represent the loudspeakers for the left hand and right hand channels, respectively. The remaining part of the apparatus serves for the digital data processing. In the first place a small separate microprocessor or microcomputer 14 is provided. This can be easily integrated in a small component 11, together with clock regenerator 12 and demodulator 13. The latter two are fed by the multiplex output of radio receiver 21. The information words retrieved according to the invention from the broadcast signal and forwarded to microprocessor 22 along an eight bit wide bus 23. Component 11 now operates completely independent from microprocessor 22. The latter's programming may be structured in an arbitrary way with respect to the functioning of component 11. Component 11 thus outputs the user words, block number, error data for each block and, if required, cumulative error data indicating the actual state of the error recovery procedure. The bus data format is not related to the present invention, and may well be one of several well-known universal bus formats. Microprocessor 22 may process the user words, i.e. store them in non-volatile RAM 17, display them on a visible display element not shown, convert them into a speech signal output, or use them as control signals for radio receiver 21.

Figure 6:
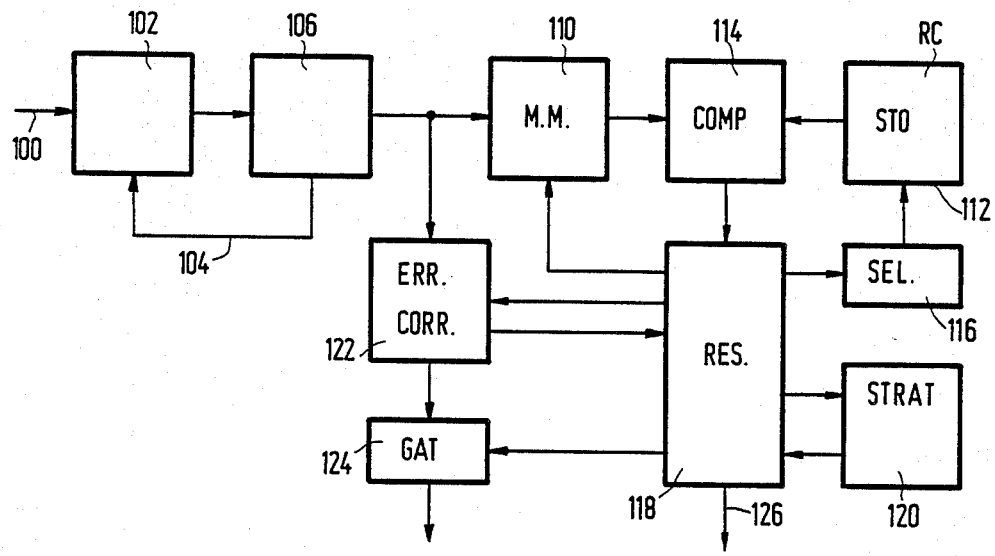
FIG. 6 is a more functional diagram of certain parts of such a device.

FIG. 6 is a more functional diagram of certain parts of a device according to FIG. 5. Input 100 is fed by radio receiver 21 in FIG. 5. Block 102 is an interrogation device that interrogates input 100 at regularly spaced intervals as signalled by control signals on line 104. Block 106 receives the binarized input values from block 102 and determines the optimum position of the bit cell boundaries and therefrom intended interrogation positions to be signalled on line 104. Furthermore, block 106 provides for demodulation of the channel bits so that a sequence of data bits is outputted on line 108. Block 110 provides for the incremental matrix multiplications specified in blocks 40, 42, 46, 52 of FIG. 3, while the increments are summed in an accumulator register. Block 112 represents a store for standard syndromes, each one corresponding with a predetermined off-set word. Block 116 is a selection element, whereby either all standard syndromes or only a selection thereof are activated for comparison to an actual syndrome. Block 114 is the actual comparator, that in the preferred embodiment operates on ten-bit syndromes received in parallel. The result is positive or negative and communicated to result evaluation element 118. The result evaluation element 118 feeds block 110 with a signal for signalling the positive output in block 44, or the negative output in block 44 (calculate next syndrome or update the syndrome, respectively). Block 118 also signals in block 50, 66, whether the next syndrome is to be calculated in the synchronized state, or in the non-synchronized state. Block 118 signals selection element 116 whether to unblock all standard syndromes, or only a particular subgroup of one or more standard syndromes for comparison. Block 118 signals block 122 that the block received on line 108 must be evaluated for error correction. The error correction is thereupon undertaken in block 112, the corrected information word is sent to block 124, and the correction result (single error corrected, burst error corrected, no error, correction impossible) is sent to block 118. Block 118 thereupon consults block 120 that contains the numerical value indicating the past error history. This numerical value is updated and restored. Based upon these results, either the output gate 124 is made transmissive or an appropriate user message is sent on output 126. Bit slip detection is effected by appropriate delay of the various comparison operations.

What is claimed is:

1. A method for decoding data transmitted along a data channel, said data being arranged in a sequence of groups, each group containing a fixed number of N sequential blocks, each block containing an information word of n1 bits, which by means of application of a linear error protection code has been extended to an error protected block of (n1+n2) bits, and wherein to each error protected block in a group a predetermined off-set word has been added by bitwise EXCLUSIVE ORING, which off-set word indicates the position of the error protected block in question within its group, wherein N, n1, and n2 are positive integers said method comprising the steps of:
   (a) in an initialization phase:
      (i) receiving a sequence of (n1+n2) data bits from said channel;
      (ii) generating from the sequence of (n1+n2) data bits a first syndrome by means of incremental operations, each incremental operation taking into account exactly one most recently received data bit, whereby said first syndrome has a plurality of bits;
      (iii) comparing said first syndrome to respective position-indicating standard syndromes, the latter corresponding to all possible off-set words;
      (iv) in case of non-correspondence:
         (A) omitting the least recently received data bit from said (n1+n2) data bits; and
         (B) updating said first syndrome while accounting for a still more recently received data bit;
      (v) repeating steps (iii) and (iv) until a correspondence occurs with a standard position-indicating syndrome corresponding to one of said predetermined off-set words, whereby synchronization is established;
   (b) in a user phase following step (a):
      (i) generating for each next block of (n1+n2) bits received over said data channel an associated syndrome;
      (ii) comparing the associated syndrome with at least one appropriate position indicating standard syndrome, each next block having a presumed next following position in the sequence of groups;
      (iii) in case of correspondence, outputting a first strategy controlling signal, while outputting the block's information word to a user;
      (iv) in case of non-correspondence, executing an error correction operation on the error-protected block of n1+n2 bits without its associated off-set word, while outputting a second strategy controlling signal; and
   (c) restarting step a) upon occurrence of a predetermined time-sequence of said first and second strategy controlling signals, whereby the initialization phase is restarted when a number of errors becomes too high.

2. A device for executing the method in claim 1, said device comprising:

(a) receiving means for receiving a data bit stream from said data channel,
   (b) matrix multiplication means for multiplying each received data bit by a parity check matrix incrementing a bit string to generate a syndrome bit string,
   (c) position indicating selection means,
   (d) comparison register means to compare any syndrome bit string with its position indicating standard syndrome bit string, under control of the position indicating selection means,
   (e) initialization/user phase control means for in an initialization phase deactivating said selection means, but for under control of a sequence of predetermined length of positive comparison results switching to a user phase, for therein activating said selection means,
   (f) an error evaluation device having a first state for, in said user phase, under control of a positive comparison result, outputting an information word contained in an associated channel block while outputting a first strategy controlling signal, and having a second state for in said user phase under control of a negative comparison result activating an error protection device for executing an error protection operation while outputting a second strategy controlling signal, and
   (g) an error register means fed by said first and second strategy controlling signals for under control of a predetermined time-sequence thereof switching said initialization/user phase control means to the initialization phase.

3. A device as claimed in claim 2, wherein said initialization/user phase control means has counting means for counting a predetermined unbroken sequence of at least two positive comparisons before being switched to said user phase, and wherein any negative comparison result in said initialization phase is operative for resetting the initialization phase to its starting point.

4. A device as claimed in claim 2, wherein said second strategy controlling signal specifies a type of error actually found for type-dependent controlling said error register means.

5. A device as claimed in claim 2, further comprising bit slip detection means for comparing a predetermined channel data block as stored with various shifted positions of a predetermined channel data block received later, an output of said bit slip detection means controlling said comparison means for compensating for said bit slip.

6. A device as claimed in claim 5, wherein said bit slip detection means is operative for a predetermined block within a group, and wherein is provided a bit slip correction means for the next block in the same group.

7. A device as claimed in any of claims 2 to 6, wherein said error register means comprises a resettable counter that is incremented by an incorrectable error signal, but reset to zero by any other first or second strategy controlling signal, and wherein a predetermined counter position controls the switching to said initialization phase.

8. A device as claimed in claim 7, wherein said predetermined counter position is adjustable.

9. A device as claimed in any of claims 2 to 6, wherein said error register means comprises a resettable counter that is incremented by any second strategy controlling signal and reset by any first strategy controlling signal, and wherein a predetermined counter position controls the switching to said initialization phase.

10. A device as claimed in any of claims 2 to 6, comprising a broadcast receiver for receiving a broadcast signal and therefrom deriving said data bit stream, said broadcast receiver furthermore comprising a measuring means for measuring a quality level of said broadcast signal and therefrom deriving a switching control signal, and wherein said switching control signal is operative for in said initialization/user phase control means adjusting either said predetermined length or a critical value of said predetermined time-sequence.

11. A device as claimed in claim 10, wherein said first microcomputer, in addition to the information word of a block outputs at least one further data relating to an error protection situation or block organization.

12. A device as claimed in any of claims 2 to 6, comprising a radio receiver and a first microcomputer for controlling the radio receiver, in which said device also comprises a universal decoder consisting of a demodulation and clock regeneration component, the input of which is connected to a multiplex output of the radio receiver, and a broadcast data processing second microcomputer, the output of which is connected to a data input of said first microcomputer.

13. A device as claimed in claim 12, wherein said data input is a universal bus connection.

14. The method of claim 1 comprising, between steps (1a) and (1b) an additional initialization phase comprising the steps of:
  (a) generating a syndrome upon reception of a channel data block;
  (b) comparing the syndrome of (15a) with its associated position indicating standard syndrome(s);
  (c) restarting step (1a) if a negative outcome results in step (15b);
  (d) repeating (15a) and (15b) until a predetermined number of successive comparisons yields positive outcomes; and
  (e) going to step (1b) when the predetermined number is reached.

* * * * *